United States Patent [19]
Tsuji

[11] Patent Number: 6,042,392
[45] Date of Patent: Mar. 28, 2000

[54] PRINTED CIRCUIT BOARD CONNECTOR FITTING STRUCTURE

[75] Inventor: Masanori Tsuji, Shizuoka-ken, Japan

[73] Assignee: Yazaki Corporation, Tokyo, Japan

[21] Appl. No.: 08/957,861

[22] Filed: Oct. 27, 1997

[30] Foreign Application Priority Data

Oct. 28, 1996 [JP] Japan .................................. 8-285533

[51] Int. Cl.[7] .................................................. H01R 9/09
[52] U.S. Cl. ........................ 439/76.1; 361/752; 439/347
[58] Field of Search ........................... 439/76.1, 55, 892,
439/157, 347, 345, 152; 361/752

[56] References Cited

U.S. PATENT DOCUMENTS

| | | | |
|---|---|---|---|
| 4,392,701 | 7/1983 | Weidler | 439/76.1 |
| 4,422,703 | 12/1983 | Christensen et al. | 439/266 |
| 4,698,025 | 10/1987 | Silbernagel et al. | 439/79 |
| 4,722,691 | 2/1988 | Gladd et al. | 439/79 |
| 5,187,643 | 2/1993 | I-Shou | 361/391 |
| 5,375,040 | 12/1994 | Cooper et al. | 361/730 |
| 5,411,401 | 5/1995 | Chiou | 439/76.1 |
| 5,717,533 | 2/1998 | Poplawski et al. | 361/796 |
| 5,836,774 | 11/1998 | Tan et al. | 439/76.1 |

FOREIGN PATENT DOCUMENTS

| | | | |
|---|---|---|---|
| 0 838 882 A2 | 4/1998 | European Pat. Off. | H01R 23/70 |
| 003333749 | 4/1985 | Germany | 361/752 |
| 401018300 | 1/1989 | Japan | 361/752 |
| 3-226979 | 10/1991 | Japan . | |
| 404148595 | 5/1992 | Japan | 361/752 |

*Primary Examiner*—Khiem Nguyen
*Assistant Examiner*—Michael C. Zarroli
*Attorney, Agent, or Firm*—Finnegan, Henderson, Farabow, Garrett & Dunner, L.L.P.

[57] ABSTRACT

A connector housing of a PCB connector fixed to a printed circuit board accommodated in a case is joined to the case so that the case receive forces acting on the PCB connector when a mating connector is inserted to or extracted from the PCB connector by a mating connector fitting apparatus of a lever insertion type. A frame of the fitting apparatus is held to the connector housing or the case.

12 Claims, 11 Drawing Sheets

PRINTED CIRCUIT BOARD CONNECTOR FITTING STRUCTURE

BACKGROUND OF THE INVENTION

1. Field of the Invention

The present invention generally relates to a printed circuit board connector ("PCB connector") fitting structure, and particularly, it relates to a fitting structure for a secure attachment between a PCB connector fixed to a printed circuit board and a mating connector.

2. Description of Relevant Art

Figure 1:
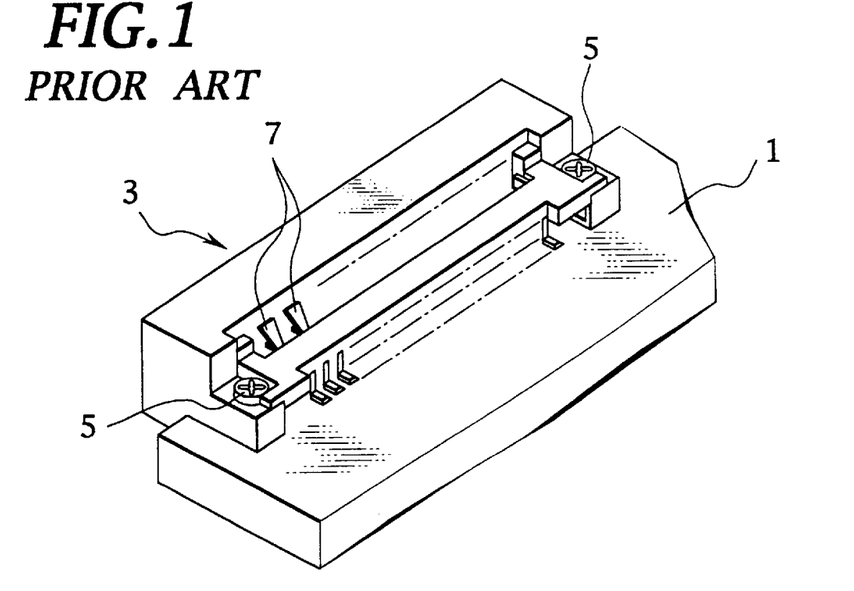
FIG. 1 is a perspective view of a conventional PCB connector fitting structure including a PCB connector fixed to a printed circuit board.

FIG. 1 shows a conventional PCB connector fitting structure illustrated in FIG. 11 of TOKKAEIHEI (Japanese Patent Application Laid-Open Publication No.) 3-226979, including a printed circuit board 1 and a PCB connector 3.

Figure 2:
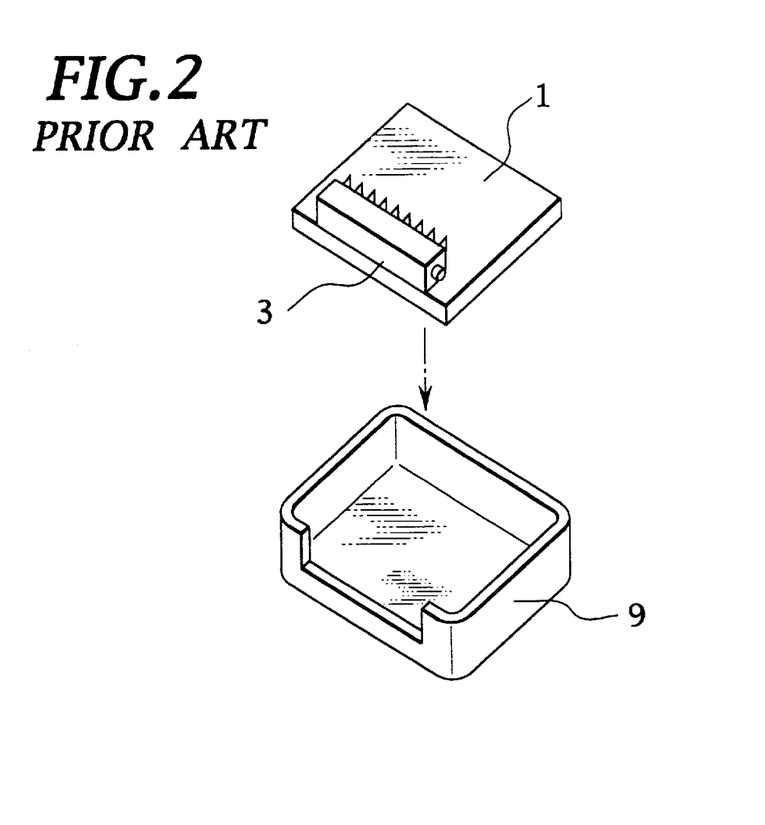
FIG. 2 is an exploded view of the conventional PCB connector fitting structure of FIG. 1 including the printed circuit board with the PCB connector fixed thereto and a case therefor.

The PCB connector 3 is fastened to the printed circuit board 1 by screws 5, 5. The circuit board 1 has an array of multiple terminals 7 individually soldered to circuitry thereof. As illustrated in FIG. 2, the circuit board 1 with the connector 3 attached thereto is accommodated to be fixed in a case 9.

An unshown mating connector fitting apparatus is set to the PCB connector 3 fixed to the case 9. The fitting apparatus is of a lever insertion type in which a cam mechanism is operable with a lever for having a mating connector forced or pulled to be inserted inside the PCB connector.

During insertion, the terminals 7 are respectively forced to fit in or on mating terminals provided in the mating connector. This fitting or mating of terminals as well as their pull-out or unmating requires application of a significant force. However, the PCB connector 3 is secured to the printed circuit board 1 simply by the screws 5 and the terminals 7 are soldered to the circuit board 1, without additional attachment measures.

Therefore, when mating or unmating the terminals, screwed or soldered parts of the PCB connector fitting structure tend to directly receive relatively great forces due to an operation of a lever of the mating connector fitting apparatus, which can cause their breakage or disconnections of associated circuits. When the operator is required to have the mating connector attached to or detached from the PCB connector, sufficient care is required so as to not cause undue forces to act on the screwed or soldered parts, thus taking a long time.

To this point, the PCB connector 3 has a mass and may produce irregular sounds due to an undesirable attachment to the case 9 such as in application to a vehicle. Thus a secure attachment of the PCB connector 3 to the printed circuit board 1 is necessary.

SUMMARY OF THE INVENTION

The present invention has been achieved with such points in view.

It therefore is an object of the present invention to provide a PCB connector fitting structure permitting a mating connector to be attached to or detached from a PCB connector in a facilitated manner without causing undue forces to act on fastened or soldered parts, while achieving a secure attachment.

To achieve the object described, a first aspect of the invention provides a printed circuit board connector fitting structure comprising a case, a printed circuit board accommodated in the case, a printed circuit board connector attached to the printed circuit board, as a first connector having a connector housing, a second connector attachable to the first connector, and support means for supporting the connector housing relative to the case to have the case receive forces acting on the first connector when the second connector is pushed in a first direction, wherealong it enters the first connector, and when the second connector is pulled in a reverse direction of the firstdirection, wherealong it exits the first connector.

According to the first aspect, when a mating connector as a second connector is inserted into a PCB connector as a first connector with pushing forces acting thereon or when it is extracted from the PCB connector with pulling forces acting thereon, the forces are transmitted to a connector housing of the PCB connector and are received by a case of a printed circuit board, as the connector housing is supported relative to the case.

Accordingly, the mating connector can be attached to or detached from the PCB connector in a facilitated manner without causing undue forces to act on those parts of the PCB connector fastened to the printed circuit board or those parts of pin terminals of the PCB connector soldered to the printed circuit board, in addition to that a secure attachment is achieved as the connector housing is supported relative to the case.

According to a second aspect of the invention depending from the first aspect, the support means comprises a joint for joining the connector housing to the case.

According to the second aspect, the connector housing is joined to the case, permitting a direct transmission of forces therebetween.

According to a third aspect of the invention depending from the second aspect, the case has an opening, the connector housing is fitted in the opening at a mediate portion thereof between a fixed end thereof attached to the printed circuit board and a attaching end thereof attachable on the second connector, and the joint comprises a groove in a circumference of the opening and a projection on the mediate portion.

According to the third aspect, a projection formed on a mediate portion of the connector housing engages with a groove formed in a circumference of an opening of the case, when the mediate portion is attached in the opening to have a fixed end of the connector housing inside the case and a attaching end thereof outside the case.

According to a fourth aspect of the invention depending from the third aspect, the groove extends in a second direction perpendicular to the first direction.

According to the fourth aspect, the projection is kept in position by the groove when the mating connector is inserted into the PCB connector and when it is extracted therefrom.

According to a fifth aspect of the invention depending from the second aspect, the joint comprises a dovetail joint.

According to the fifth aspect, the connector housing is securely attached to the case.

According to a sixth aspect of the invention depending from the first aspect, the printed circuit board connector fitting structure further comprises a connector fitting mechanism, which includes an actuator for actuating the second connector in the first direction and for actuating the second connector in the reverse direction and a frame for supporting the actuator, and hold means for holding the frame to one of the case and the connector housing.

According to the sixth aspect, the mating connector is actuated by an actuator that may be a cam mechanism operable with a lever for its insertion to or extraction from the PCB connector, with significant operational forces acting thereon in a various manner. However, a frame for supporting the actuator is held to be supported to one of the case and the connector housing, i.e. relative to the case.

According to a seventh aspect of the invention depending from the sixth aspect, the hold means comprises a pair of mutually engageable elements fixed either to both the frame and the connector housing.

According to the seventh aspect, the frame is held to the connector housing by a pair of mutually engageable elements.

According to an eighth aspect of the invention depending from the seventh aspect, the mutually engageable elements comprise a groove extending in a second direction perpendicular to the first direction, and a projection engageable with the groove.

According to the eighth aspect, a competent engagement is secured when the mating connector is inserted as well as when it is extracted.

According to a ninth aspect of the invention depending from the seventh aspect, the mutually engageable elements comprise a body portion of the connector housing, and a hood portion of the frame attachable on the body portion.

According to a tenth aspect of the invention depending from the ninth aspect, the hood portion has a hook part hooking on one side of the body portion and an abutment part abutting on another side of the body portion opposite to the one side thereof in the first direction.

According to the tenth aspect, the attachment is secured when the mating connector is inserted as well as when it is extracted.

According to an eleventh aspect of the invention depending from the sixth aspect, the hold means comprises a fixing part of the frame fixed to the case.

According to the eleventh aspect, the frame is directly fixed to the case.

According to a twelfth aspect of the invention depending from the eleventh aspect, the printed circuit board connector fitting structure further comprises a cover for enclosing the case, and a screw for fastening the cover and the fixing part of the frame to the case.

According to the twelfth aspect, a voluntary number of fixing screws can be commonly utilized.

BRIEF DESCRIPTION OF THE ACCOMPANYING DRAWINGS

The above and further objects and novel features of the present invention will more fully appear from the following detailed description when the same is read in conjunction with the accompanying drawings, in which.

DETAILED DESCRIPTION OF THE PREFERRED EMBODIMENTS

There will be detailed below the preferred embodiments of the present invention with reference to the accompanying drawings. Like members are designated by like reference characters.

Figure 3:
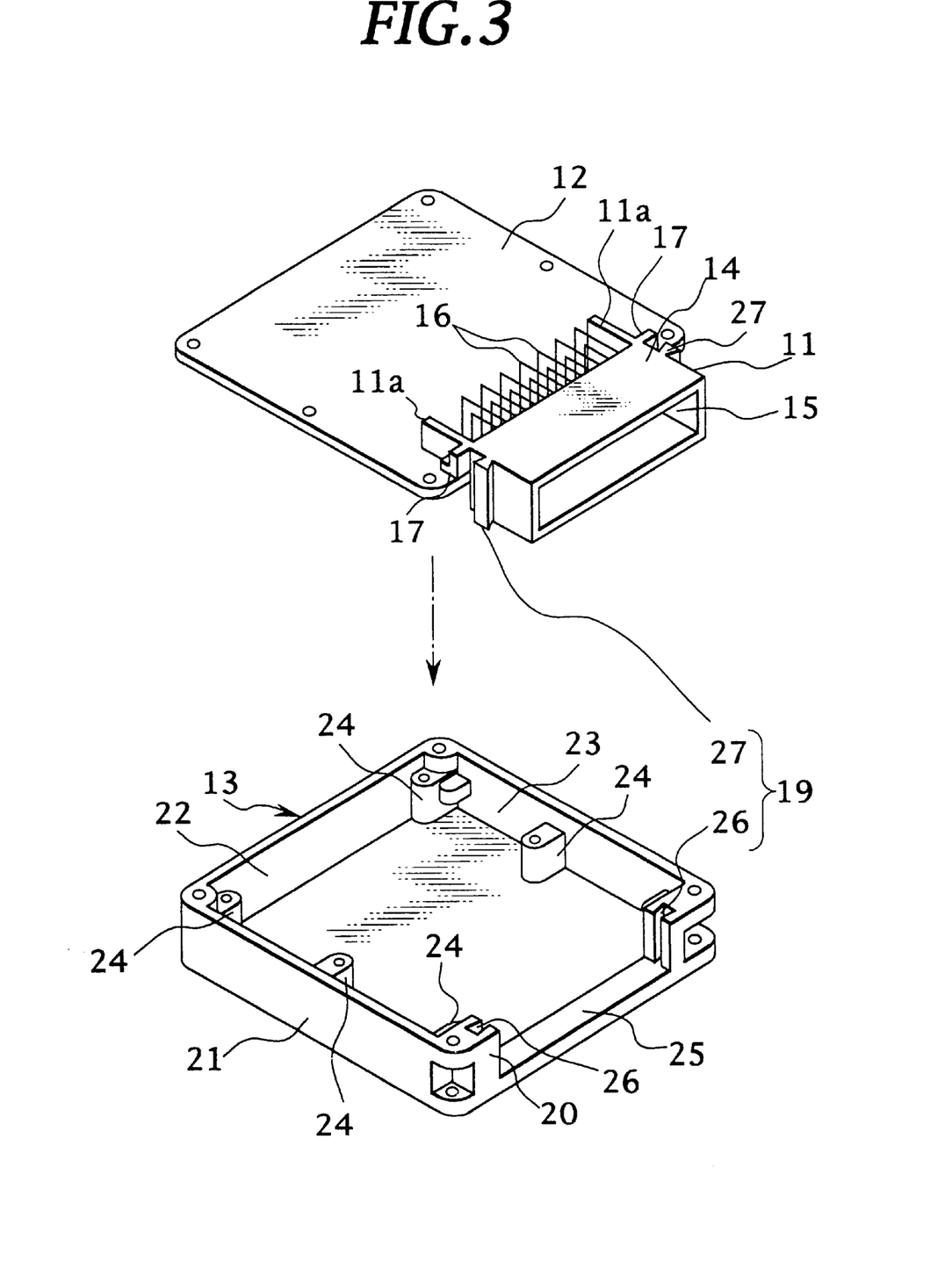
FIG. 3 is an exploded view of a PCB connector fitting structure according to an embodiment of the invention including a printed circuit board, a PCB connector fixed thereto and a case therefor.
Figure 4A:
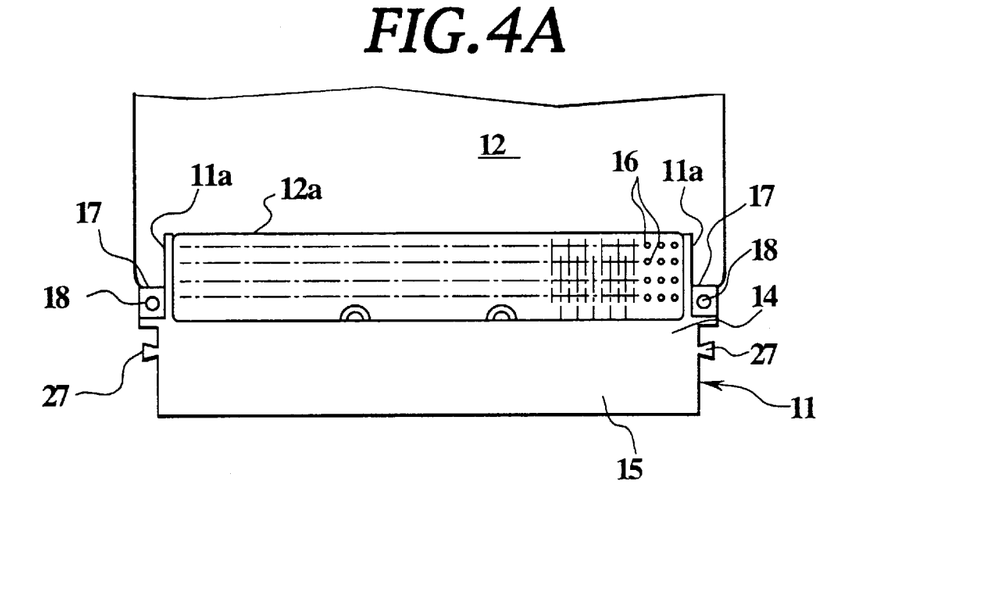
FIG. 4A is a plan of the PCB connector fixed to the printed circuit board of FIG. 3.
Figure 4B:
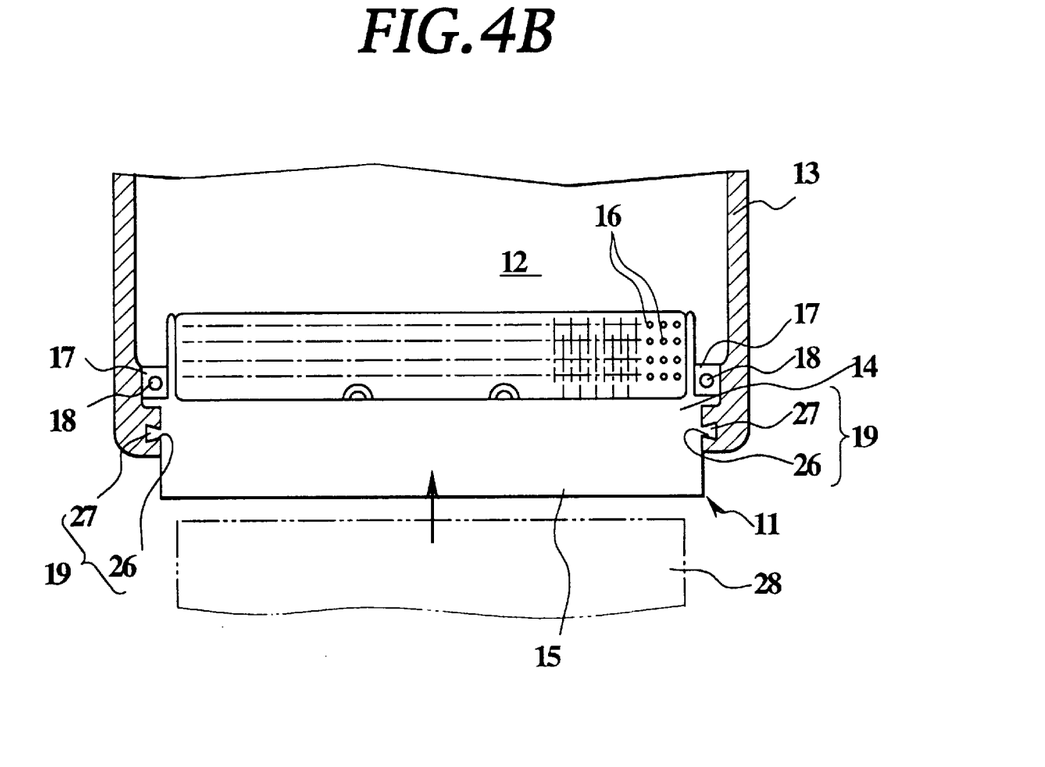
FIG. 4B is a plan of the PCB connector fixed to the printed circuit board and set in the case of FIG. 3.

FIGS. 3, 4A and 4B show a PCB connector 11 according to a first embodiment of the invention, and a case 13 having a rectangular printed circuit board 12 accommodated thereintogether with the connector 11 fixed thereto.

The connector 11 comprises a so-called female type connector having a housing 14 integrally formed with a hood portion 15. The housing 14 accommodates therein an array of pin terminals 16 with their projecting free ends inside the hood portion 15. A mating male connector 28 will be inserted to be fitted In the hood portion 15, where its unshown terminals will mate with the pin terminals 16 for electrical connections. The pin terminals 16 are arrayed between protective projections 11a of the housing 14, and soldered for electrical connections at their base ends to conductors in a pin hole region 12a of the printed circuit board 12. The housing 14 of PCB connector 11 is longer in a width direction than in a connector fitting direction and has at both longitudinal ends thereof a pair of mount portions 17 secured by screws 18 to a peripheral region at this side of the printed circuit board 12. The connector 11 is joined to the case 13 by a pair of dovetail joints 19 (hereafter sometimes collectively referred to as "supporting portion", as the printed circuit board 12 is placed in the case 13.

The case 13 has four side walls 20, 21, 22 and 23 defining a rectangular hollow space slightly greater in size than outside dimensions of the printed circuit board 12. A boss 24 for a screw fastening is formed on a middle portion of each of the side walls 21 and 23, as well as at each interconnecting portion between the side walls 20, 21, 22 and 23, that is, at each corner therebetween.

An outer peripheral portion of the printed circuit board 12 received within the hollow space is screwed to the boss 24 so that the printed circuit board 12 is housed within and attached to the case 13. A middle portion of the side wall 20 is cut in a rectangular form to provide a recess portion 25. When the printed circuit board 12 is housed within the case 13, the housing 14 of the connector 11 rests in the recess portion 25. As the connector 11 fits in the recess portion 25, the connector 11 is supported relative to the case 13 through the supporting portion 19.

The supporting portion 19 comprises a pair of groove portions 26 provided in the case 13 and a pair of projecting portions 27 provided in the connector 11 for engagement with the groove portions 26. The groove portions 26 are provided on both opposing inner walls of the recess portion 25. The connector 11 is attachable to the case along a fitting direction of the connector 11 into the recess portion 25. Further, the groove portion 28 is formed as a dovetail groove wherein the groove is narrower at the opening that is proximate to the recess portion 25 and wider at the surface that is distal to the recess portion 25.

The projecting portion 27 is provided at each of both side walls of the connector 11 in the longitudinal direction in such a manner as to project therefrom and such that the projecting portion 27 is engageable with the groove portion 26. Further, the projecting portion 27 is formed in a dovetail shape having a front end portion of a width wider than a width of the side wall portion.

When the connector 11 is inserted the recess portion 25, the projecting portion 27 is inserted into and engaged with the groove portion 26. In this state, the forces necessary for attaching the mating connector to the connector 11 as well as the pulling forces (mating cancelling forces) for detaching the mating connector from the connector 11 are reeived by the case 13 having the projecting portion 27 within the groove portion 26 and contacting with the inner wall of the groove portion 26.

There will be described below a procedure for housing the connector 11 in the case 13.

As shown in FIG. 3, the connector 11 is previously connected to the one end portion of the printed circuit board 12 by screws 18 (not shown), and the rear ends of the pin terminals within the housing 14 of the connector 11 are soldered to the printed circuit board 12.

In this state, as shown in FIG. 4B, the printed circuit board 12 is housed within the case 13, the connector 11 is placed in the recess portion 25, the projecting portions 27 are inserted into the groove portions 26, and the housing 14 of the connector 11 is fitted in the recess portion 25 (not shown). In this state, the hood portion 15 extends beyond the perimeter of the case 13. Next, the printed circuit board 12 is attached to the case 13 by screwing the outer peripheral portion of the printed circuit board 12 to the bosses 24.

Then, the mating connector 28 is inserted into and attached to the hood portion 15. The attachment forces are imposed on the connector 11 from the mating connector 28. These forces act on the case 13 through the supporting portion 19 and are received by the case 13. Thus, the fitting forces are transmitted to the case 13 having the projecting portions 27 in contact with the inner walls of the groove portions 26.

Accordingly, the connector 11 is supported relative to the case 13, without undue forces acting on the pin terminals 16 when the mating connector 28 is attached.

Further, when removing the mating connector 28 from the hood portion 15, the pulling forces acting on the connector 11 are born by the case 13 through the supporting portion 19. That is, the removing forces are born by the case 13 having the projecting portions 27 in contact with the inner walls of the groove portions 26.

In accordance with this embodiment, as the connector 11 is supported relative to the case 113, the attaching force for attaching the mating connector 28 to the connector 11 as well as the removing force for removing the mating connector 28 from the connector 11 is born by the case 13, so that no undue forces are directly imposed on the pin terminals 16. Accordingly, their soldered portions and mating portions are kept free from undue forces when attaching the mating connector 28 as well as when removing, thus permitting a secured prevention of a disconnection of circuit.

Further, the attaching operation and the removing operation are more easily performed as it is unnecessary to press the connector 11 when attaching the mating connector 28 to the connector 11 as well as when removing.

In this embodiment, the groove portions 26 are provided in the opposing inner walls of the recess portion 25 and the projecting portions 27 are provided on both side walls of the housing 14 of the connector 11. However, the groove portions 26 may be provided in both side walls of the housing 14 and the projecting portions 27 may be provided on the inner walls of the recess portion 25.

There will be described a second embodiment of the invention with reference to FIGS. 5 to 7.

Figure 6A:
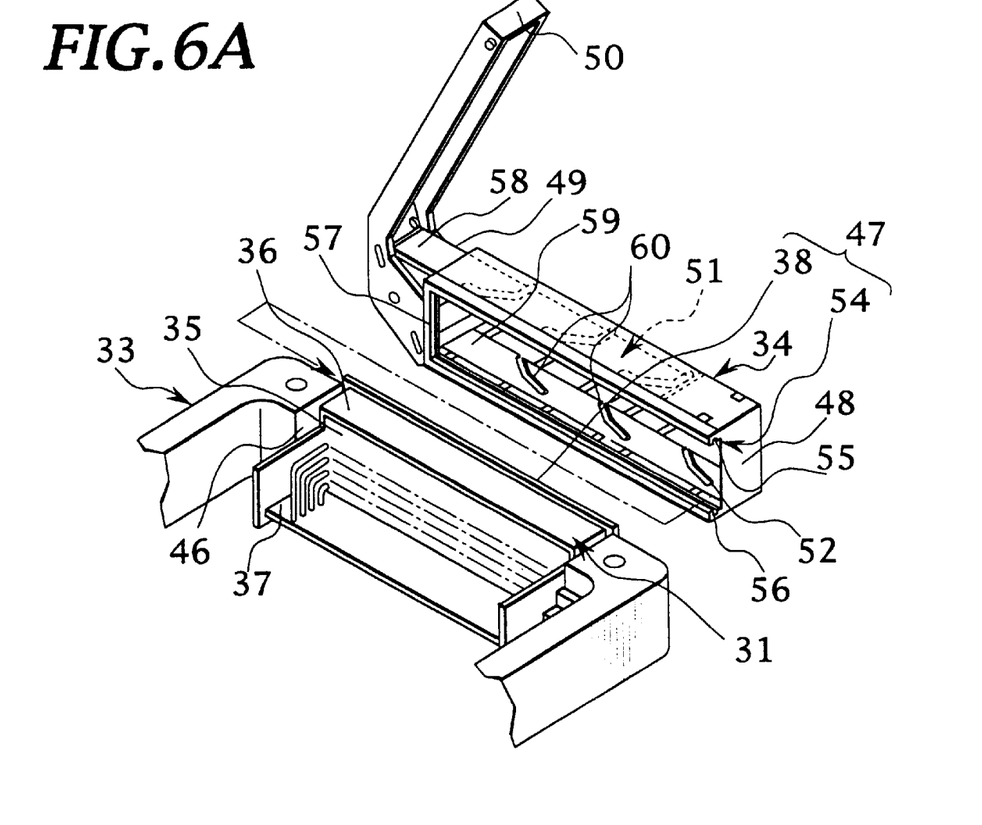
FIG. 6A is a perspective view of the PCB connector fitting structure of FIG. 5, with a mating connector fitting apparatus to be set thereto.
Figure 7:
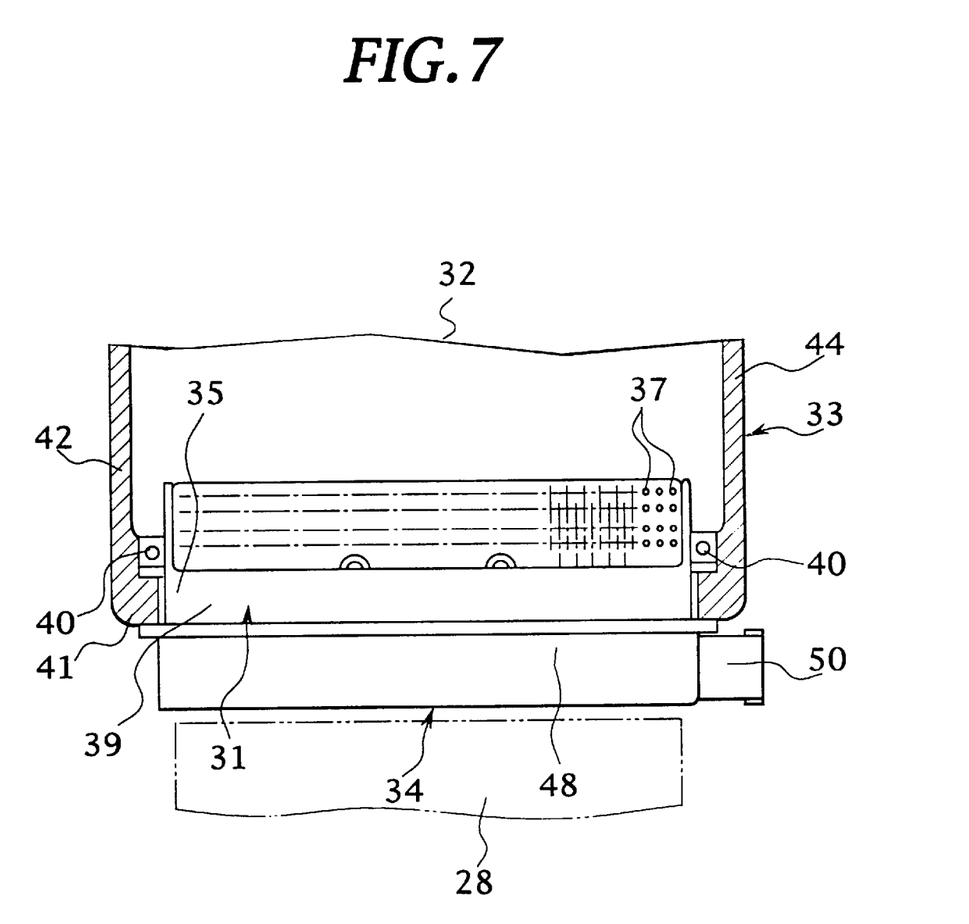
FIG. 7 is a plan of the PCB connector fitting structure of FIG. 5, with the mating connector fitting apparatus set thereto.

This embodiment employs a lever type fitting apparatus 34 (see FIG. 6A) when attaching the mating connector 28 as shown in FIG. 7 to a PCB connector 31, as well as when removing.

Figure 5:
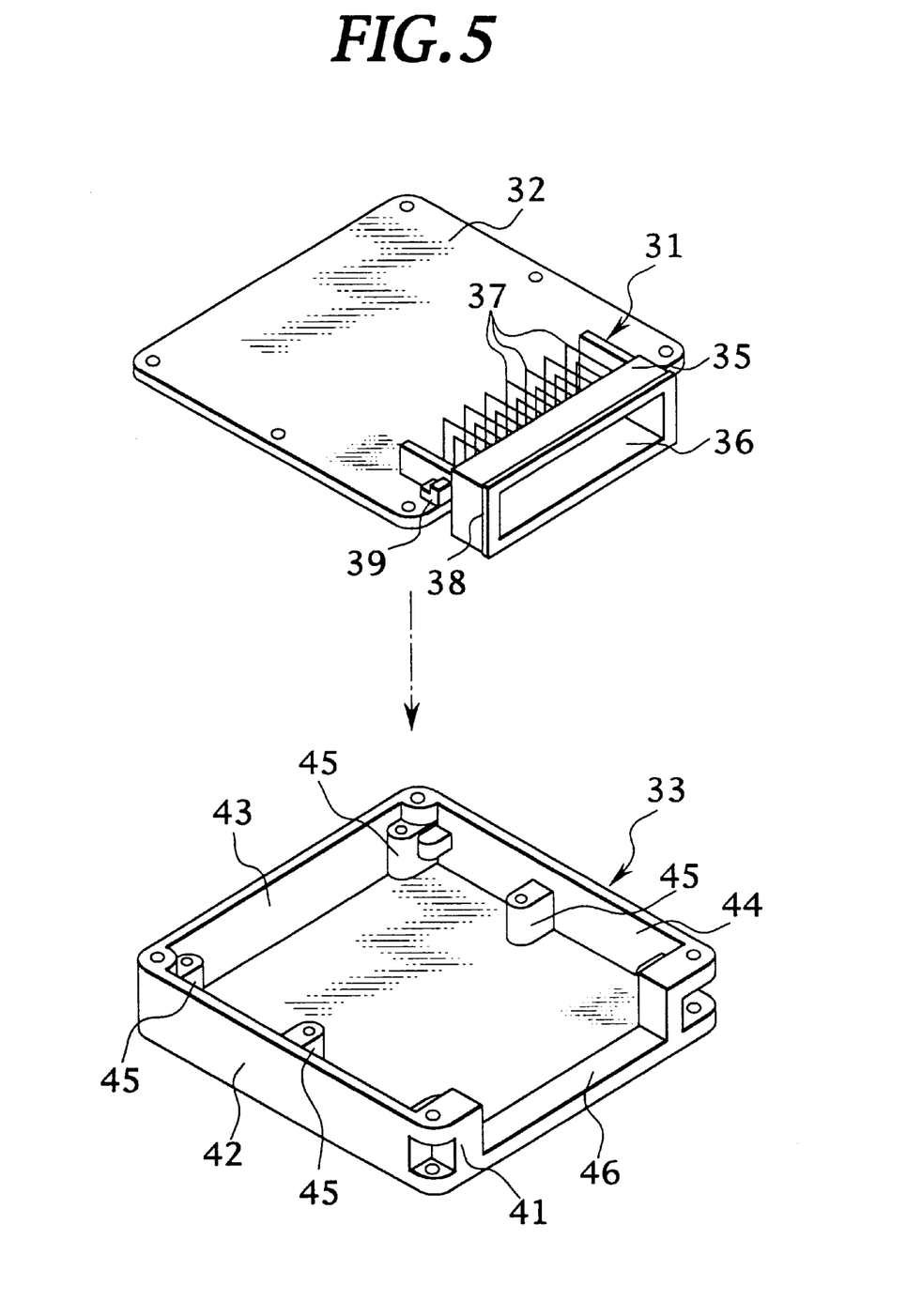
FIG. 5 is an exploded view of a PCB connector fitting structure according to another embodiment of the invention including a printed circuit board, a PCB connector fixed thereto and a case therefor.

FIG. 5 shows the connector 31 and a case 33 in which the connector 31 is housed together with a printed circuit board 32. Further, FIG. 6A is a perspective view which shows the fitting apparatus 34, and FIG. 6B is a cross sectional view which shows the fitting apparatus 34 mounted to a fitting surface end of the connector 31.

As shown in FIG. 5, the connector 31 is a so-called female connector and is integrally formed with a housing 35 and a hood portion 36, as in a similar manner to the connector 11 of the first embodiment. A plurality of pin terminals 37 are received within the housing 36, and an end of each of the pin terminals 37 is projected into the hood portion 36. A mating male connector is inserted into and attached to the hood portion 36, and its mating terminals are electrically connected to the pin terminals 37 by a mating therebetween. Further, a fixing wall portion 38 projecting out from an opening edge portion is provided in an attachment surface end between the hood portion 38 and the mating connector, around the entire periphery.

The other end of each of the pin terminals 37 received within the housing 35 is extended from the housing 35 and is soldered to the printed circuit board 32 having a rectangular plate shape. The connector 31 in which the pin terminals 37 are received is attached to the printed circuit board 32 by supporting mount portions 39 provided in both sides of the housing 35 in a longitudinal direction to a side portion of the printed circuit board 32 by screws. Then, when the connector 31 is mounted to the one end, the printed circuit board 32 is housed within the case 33.

The case 33 has four side walls 41, 42, 43 and 44 defining a rectangular hollow space slightly greater in size than outside dimensions of the printed circuit board 32. A boss 45 for a screw fastening is formed on a middle portion of each of the side walls 42 and 44, as well as at each interconnecting portion between the side walls 41, 42, 43 and 44, that is, at each corner therebetween.

An outer peripheral portion of the printed circuit board 32 received within the hollow space is screwed to the boss 45 so that the printed circuit board 32 is housed within and attached to the case 33. Further, a rectangular recess portion 46 is formed in a middle portion of the side wall 41. When the printed circuit board 32 is housed within the case 33, the housing 35 of the connector 31 is inserted in the recess portion 46. In this case, the fitting apparatus 34 is mounted to the opening edge portion of the hood portion 36 through a mounting mechanism 47 (see FIG. 6B).

The fitting apparatus 34 comprises a frame member 48 extended through the inner portion thereof, a moving member 49 connected to the inner side of the frame member 48 in such a manner as to move in a longitudinal direction, an operating lever 50 for driving the moving member 49 by receiving an operating force and a cam mechanism provided between the moving member 49 and the mating connector.

The frame member 48 is provided at one side with an opening portion 52 mounted to the connector 31 and at the other side with an opening portion 53 into which the mating connector is to be inserted. A fixing groove portion 54 having an inverted-C cross sectional shape is formed in an edge portion of the opening portion 52. The fixing groove portion 54 comprises upper and lower groove portions 55 and 56 extending in a longitudinal direction of the opening portion 52 and a vertical groove portion 57 interconnecting left ends of the groove portions 55 and 56, while a portion opposing to the vertical groove portion 57 is open. A groove width of the fixing groove portion 54 is sized to be slightly larger than the thickness of the fixing wall portion 38 provided in the hood portion 36 of the connector 31.

As shown in FIG. 6A. the fixing wall portion 38 is slidably insertable into the fixing groove portion 54, after positioning one side of the connector 31 to the open end of the fixing groove portion 54 to one side portion of the connector 31. Accordingly, the fitting apparatus 34 is mounted to the fitting surface end of the connector 31.

The moving member 49 is paired as a combination of upper and lower plates 58 and 59 slidable in opposite directions, and is assembled to the upper and lower inner walls of the frame member 48. Three arcuate cam grooves 60 are formed in each sliding plate 58, 59. A projection (not shown) provided in the housing of the mating connector is engaged with each cam groove 60. Further, the sliding plates 58 and 59 are operatively connected at their left ends to the operating lever 50.

The operating lever 50 is disposed at one end of the frame member 48, and is pivoted to the frame member 48 for a rotary operation between an open position at a predetermined angle and a closed position on the frame member 48. The sliding plates 58 and 59 are movable in the longitudinal direction of the frame member 48 by rotating the lever 50 between the open position and the closed position with an operating force.

The mount mechanism 47 comprises the fixing wall portion 38 at the opening edge portion of the hood portion in the connector 31, and the fixing groove portion 54 to which the fixing wall portion 38 is attached.

There will be described a procedure for housing the printed circuit board 32 and the connector 31 in the case 33, and a procedure for attaching the mating connector to the connector 31.

As shown in FIG. 5, when the connector 31 is attached to the one end of the printed circuit board 32, the printed circuit board 32 is received within the hollow space of the case 33 and the connector 31 is inserted into the recess portion 46. In this case, the attachment wall of the hood portion 36 in the connector 31 extends beyond the perimeter of the case 33.

Figure 6B:
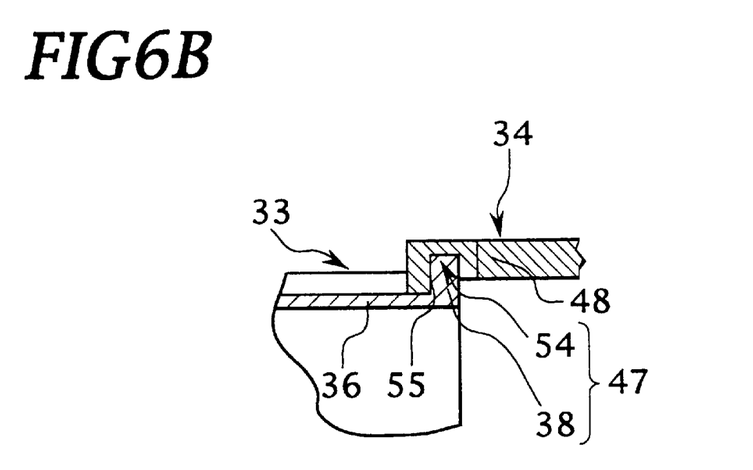
FIG. 6B is a partial sectional view of the PCB connector fitting structure of FIG. 5, with the mating connector fitting apparatus set thereto.

Next, as shown in FIG. 6A. the fitting apparatus 34 is positioned to the one side of the connector 31. and as shown in FIGS. 6B and 7, the fixing wall portion 38 is slidably attached to the fixing groove portion 54. Accordingly, the one side of the fitting apparatus 34 is mounted to the attachment surface end of the connector 31. In this state, the operating lever 50 is put in the open position apart from the closed position. The moving member 49 is operated to move in the frame member 48. Then, the mating connector is inserted into the frame member 48 from the opening in the other side of the fitting apparatus 34, as the projections projecting from the housing in the mating connector are respectively engaged with the cam grooves 60.

Next, the operating lever 50 is rotated to the frame member 48 end and the sliding plates 58 and 59 are moved in the longitudinal direction of the frame member 48. The projection within the cam groove 60 is guided by the cam groove 60, as the sliding plates 58 and 59 longitudinally move in the frame member 48. With thrust forces then developed, the mating connector is inserted to be attached to the hood portion 36 of the connector 31.

In this case, when the mating connector 28 is inserted into the hood portion 36, the mating connector 28 presses the connector 31 to the inner side of the case 33. As the fixing wall portion 38 of the connector 31 is attached to the fixing groove portion 54 of the fitting apparatus 34, forces from the mating connector 28 act on the frame member 48. Accordingly, when that the mating connector 28 is inserted into and attached to the hood portion 36 of the connector 31, the connector 31 and the mating connector 28 are operated to draw each other due to connection between the fitting apparatus 34 and the connector 31.

Therefore, when inserting and attaching the mating connector to the hood portion 36 of the connector 31, no undue forces are imposed from the connector 31 to the cas 33 nor to the printed circuit board 32. Accordingly, no undue forces act on those pin portions extended from the other side of the connector 31 and soldered to the print circuit board 32 nor on mating pin portions.

For a removal of the mating connector 28 inserted and fitted within the hood portion 36 of the connector 31, the operating lever 50 of the fitting apparatus 34 is rotated from the closed position on the frame member 48 to the open position opening relative to the frame member 48. When th operating lever 50 is rotated to the position open from th frame member 48, the sliding plates 58 and 59 move to ends of the frame member 48 in the longitudinal direction. As the sliding members 68 and 59 move, the projections engaging with the cam grooves 60 move along the cam groove 60 so that the mating connector 28 comes out of the hood 3 of the connector 31.

At this time, forces are applied to the hood portion 36 of the connector 31 in a direction in which the mating connector 28 comes out, that is, in a draw-out direction o the mating connector 28. However, as the fixing wall portion 38 is engaged with the inner wall of the fixing groove portion 54, the movement is restricted. On the other hand, as the mating connector is pulled, the frame member 48 is forced toward the connector 31. However, as the fixing wall portion 38 is engaged with the inner wall of the fixing groove portion 64, this movement also is restricted.

Accordingly, like the case of inserting and fitting the mating connector 28 to the connector 31, the connector 31 and the mating connector repel each other to be apart from each other. Therefore, no undue forces are applied to the case 33. Also when inserting and attaching the mating connector to the hood portion 36 of the connector 31, no undue forces are imposed from the connector 31 on the case 33 nor on the printed circuit board. Accordingly, the pin portions extended from the other side of the connector 31 and soldered to the printed circuit board 32 are kept free from undue forces.

In accordance with this embodiment the connectors 28, 31 push or pull each other when the fitting apparatus 34 is operated to have the mating connector 28 attached to or removed from the connector 31 fixed to the printed circuit board 32 in the case 33. However, the connector 31 is kept attached in position to the printed circuit board 32. As a result, no undue forces are imposed on soldered portions of the pin terminals 37, therefore preventing circuit disconnection.

Further, when moving the mating connector 28 for attachment to or removal from the PCB connector, it is unnecessary for an operator to hold the PCB connector 31 to eliminate slippage, facilitating the attachment or removal operation.

Still further, in accordance with this embodiment, by using the fitting apparatus 34, the attaching operation and the removing operation of the mating connector to and from the PCB connector can be easily performed.

Furthermore, since the fitting wall portion 38 can be engaged with the fitting groove portion 54 by simply sliding the fitting apparatus 34, the mounting operation of the fitting apparatus 34 to the connector 31 is easily performed.

Moreover, in accordance with this embodiment, the attachment between the PCB connector 31 to the printed circuit board 32.

Figure 8:
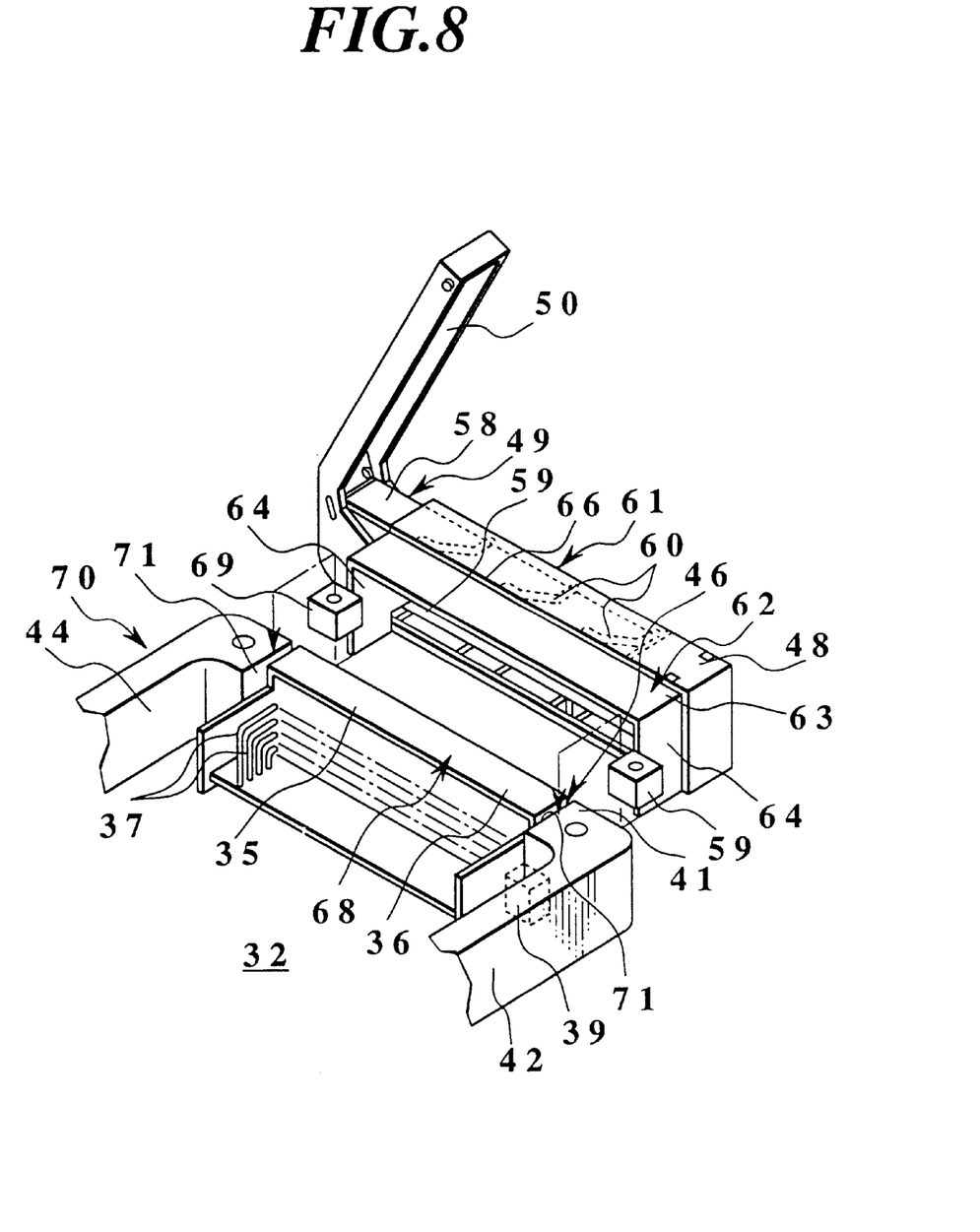
FIG. 8 is a perspective view of a PCB connector fitting structure according to another embodiment of the invention, with a mating connector fitting apparatus to be set thereto.

There will be described below a third embodiment of the invention with reference to FIGS. 8, 9A and 9B. This embodiment employs a fitting apparatus 61 different from that of the second embodiment. Like members are designated by like reference characters.

In the fitting apparatus 61 in accordance with this embodiment, a mount hood portion 62 is provided for an opening portion 52 (see FIG. 9B) of a frame member 48. The mount hood portion 62 is formed as an inverted-C cross sectional shape with an upper wall portion 63 extending in a longitudinal direction of the frame member 48 and a pair of opposing wall portions 64 and 64 downwardly extending from both ends of the upper wall portion 63 in an opposing manner, while a lower side is open.

Figure 9A:
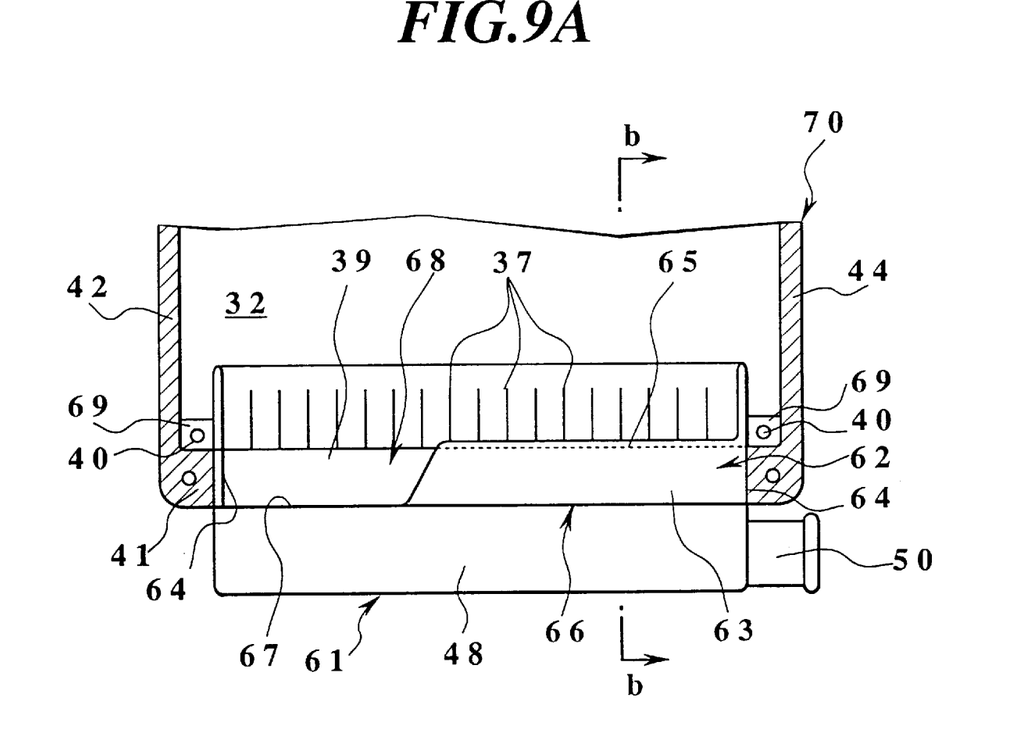
FIG. 9A is a plan of the PCB connector fitting structure of FIG. 8, with the mating connector fitting apparatus set thereto.
Figure 9B:
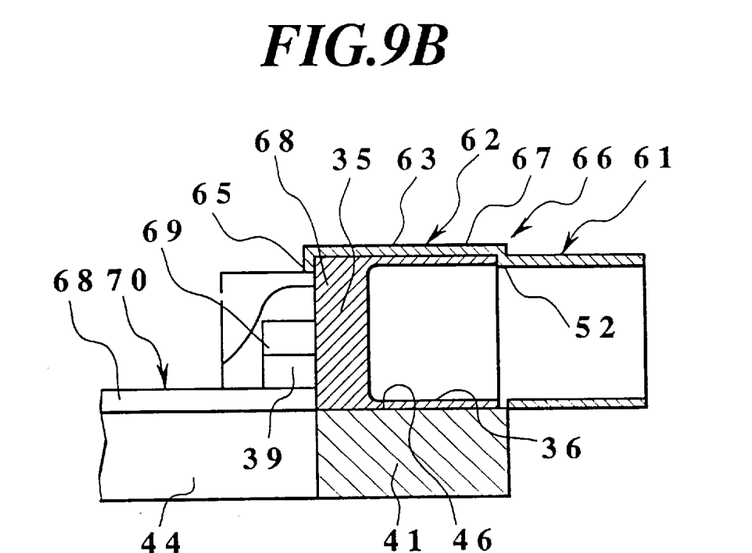
FIG. 9B is a partial sectional view of the PCB connector fitting structure of FIG. 8, with the mating connector fitting apparatus set thereto.

A hooking portion 65 projecting in an inward direction in FIGS. 9A and 9B is formed on a respective front end portion of the upper wall portion 63 and the opposing wall portions 64 and 64. A step portion 66 is formed between the frame member 48 and a rear end of the upper wall portion 63 and the opposing wall portions 64 and 64, and a contact portion 67 is formed on an inner side of the step portion 66. Then, as shown in FIGS. 9A and 9B, the hood portion 36 of a PCB connector 68 is brought into contact with the contact portion 67, so that the hook portion 65 is hooked to a rear end of a housing 35 of the connector 68.

Further, mount portions 69 are respectively formed on the opposing wall portions 64 and 64. The mount portions 89 are placed on the mount portion 39 for attaching the connector 68 to a printed circuit board 32 by screws, and are screwed to the printed circuit board 32 together with the mount portion 39.

Then, the hook portion 65 of the mount hood portion 62 and the contact portion 67 constitute a mount means in this embodiment.

In this case, the fitting apparatus 61 in accordance with this embodiment essentially has the same structure and the same function as those of the fitting apparatus 34 in the second embodiment.

On the contrary, a case 70 in accordance with this embodiment essentially has the same structure as that of the case 33 in the second embodiment, and the recess portion 46 provided on the side wall 41 of the case 70 is set to have a slightly longer size than the width of the connector 68. Accordingly, gaps 71 and 71 are provided between both side walls in the longitudinal direction of the connector 68 and the opposing inner wall of the recess portion 46. The opposing wall portions 64 and 64 of the mount hood portion 62 are inserted in the gaps 71 and 71 from above the housing 35, as shown in FIG. 8.

There will be described below a procedure for housing the printed circuit board 32 and the connector 68 in the case 70 and a procedure for attaching the mating connector to the connector 68.

When attaching the connector 68 to one side portion of the printed circuit board 32, the printed circuit board 32 is housed within a hollow space in the case 70, and is screwed to bosses 45. At this time, the connector 68 is inserted in a recess portion 46 of the case 70. As the connector 68 is inserted in the case 70, the gaps 71 and 71 are defined between both side walls of the connector 68 and opposing inner walls of the recess portion 46.

Next, when an operating lever 50 is in an open position apart from the frame member 48, the opposing wall portions 64 and 64 are inserted in the gaps 71 and 71 while the fitting apparatus 34 is located above the connector 68 and the mount portion 69 is housed in the case 70. When the opposing wall portions 64 and 64 are completely inserted in the gaps 71 and 71, as shown in FIGS. 9A and 9B, a front end portion of the hood portion 36 in the connector 68 is brought into abutment with the contact portion 67 and the hook portion 65 is hooked to a rear portion of the housing 35 in the connector 68. Further, the mount portion 69 at the mount hood portion 63 is end mounted on the mount portion 39 for attaching the connector 68 to the printed circuit board 32 is screwed to the printed circuit board 32. Accordingly, the fitting apparatus 61 is attached to the connector 68.

In this state, the mating connector is inserted from the other opening portion of the frame member 48, and projections from the mating connector are engaged with cam grooves 60. Then, the operating lever 50 is rotated toward the upper surface of the frame member 48, and sliding plates 58 and 59 are moved toward the other side in the longitudinal direction of the frame member 48. The projections are moved relative to the connector 68 in the cam grooves 60 by movements of the sliding plates 58 and 59, so that the mating connector is inserted into the hood portion 36 of the connector 68.

At this time, the fitting apparatus 61 is subjected to force in a direction in which it is pulled from the connector 68. However, the fitting apparatus 61 is supported relative to the housing 35 of the connector 68 by the hook portion 65, and the movement is restricted. On the other hand, the connector 68 is subjected to forces in a direction in which it goes away from the fitting apparatus 61, as it receives the fitting force from the mating connector. However, the hood portion 36 is brought into abutment with the contact portion 67, and this movement also is restricted. Accordingly, the forces acting on to the fitting apparatus 61 and the forces acting on the connector 68 cancel each other. As a result, there are left no undue forces acting on the connector 68 nor on the pin terminals 37 to have moving tendencies.

When removing the mating connector from the hood portion 36 of the connector 68, the operating lever 50 on the frame member 48 is rotated to the open position apart from the position on the frame member 48. As the operating lever 50 is rotated to the open position, the projections are moved relatively along the cam grooves 60 in a direction in which they move away from the connector 69, and the mating connector is moved in a direction in which it is pulled outside the hood portion 36 of the connector 68.

At this time, the fitting apparatus 61 is subjected to forces in a direction in which it moves toward the connector 68. However, the fitting apparatus 61 is supported relative to the connector 68 by the contact portion 67, and the movement is restricted. On the other hand, the connector 68 is subjected to forces in a direction in which is moves toward the fitting apparatus 61, as it receives the drawing force from the mating connector. However, the hood portion 36 is brought into abutment with the contact portion 67, and this movement also is restricted. Accordingly, the forces acting on to the fitting apparatus 61 and the forces acting on the the connector 68 cancel each other. As a result, there are left no undue forces acting on the connector 68 nor on the pin terminals 37 to have moving tendencies.

In accordance with this embodiment, the PCB connector 68 and the mating connector 28 are caused to push and pull each other when the connector 68 attached to the printed circuit board 32 in the case 70 is attached to the mating connector or removed therefrom by an operation of the fitting apparatus 61. However, the connector 68 does not move relative to the printed circuit board 32. Therefore, no undue forces act on soldered portions of the pin terminals 37 nor on the printed circuit board 32, thus preventing circuit disconnection.

Further, it is unnecessary to hold the PCB connector when moving the mating connector in an attaching operation of the mating connector to the PCB connector as well as in a removing operation thereof, and the attaching operation and the removing operation can be easily performed.

Still further, when attaching the fitting apparatus 61 to the PCB connector 68, the housing 35 is held by the mounting hood portion 62 with a sufficient locking force, so that the mount operation of the fitting apparatus 61 to the connector can be easily performed.

In this embodiment, the mount hood portion 62 is screwed to the printed circuit board 32 at the mount portion 69. The mount portion 69 may however be omitted.

Next, a fourth embodiment shown in FIGS. 10, 11A and 11B will be described below. In this embodiment, the structure of a case 74 is different from that of the second embodiment. Further, a fitting apparatus 72 essentially has the same structure and the same function as the fitting apparatus 34 of the second embodiment, subject to a difference in structure for rotatably supporting an operating lever 73 with respect to the frame member 48.

Figure 10:
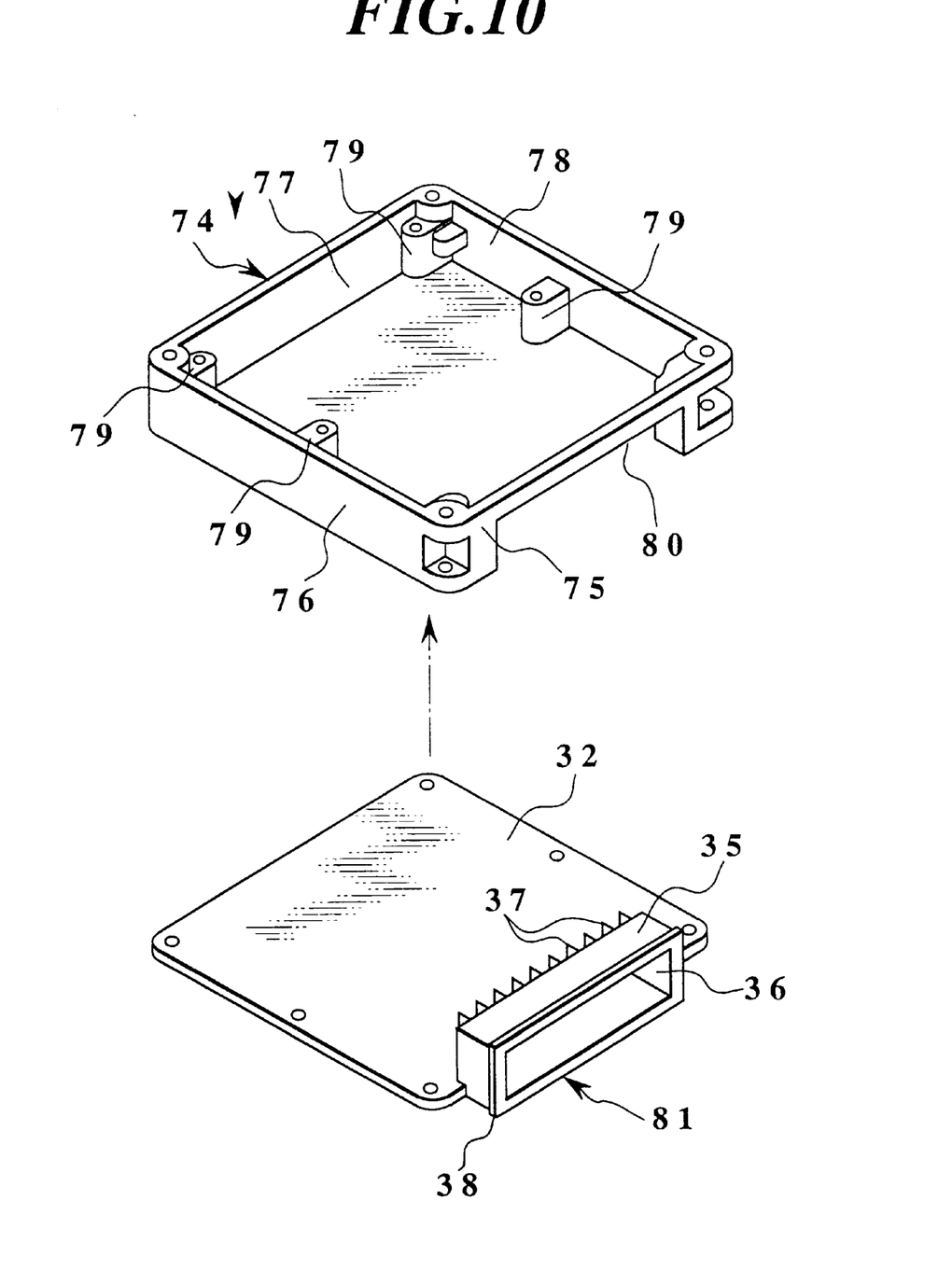
FIG. 10 is an exploded view of a PCB connector fitting structure according to another embodiment of the invention including a printed circuit board, a PCB connector fixed thereto and a case therefor.

As shown in FIG. 10, the case 74 in accordance with this embodiment is formed with four side walls 75, 76, 77 and 78 defining a rectangular hollow space slightly greater in size than outside dimensions of the printed circuit board 32. Bosses 79 are formed on middle portions of the side walls and corner portions therebetween. The printed circuit board 32 is housed in the hollow inner space surrounded by the side walls 75, 76, 77 and 78 and the outer peripheral portion of the printed circuit board 32 is screwed to the bosses 79, so that the printed circuit board 32 is housed within and attached to the case 74. Further, the side wall 75 has a middle portion thereof cut to provide a downwardly opening rectangular recess portion 80. When the printed circuit board 32 is housed in the hollow space of the case 74 as indicated in FIG. 10, the housing 35 of a PCB connector 81 is inserted in the recess portion 80. In this case, when the housing 35 of the connector 81 is inserted in the recess portion 80, the front end portion of the hood portion 36, that is, the fixing wall portion 38 projects from inside of the case 74. The fixing wall portion 38 is inserted in and attached to the fixing groove portion 54 of the fitting apparatus 72.

The fitting apparatus 72 essentially has the same structure and the same function as the fitting apparatus 34 of the second embodiment, as described.

Next, in accordance with this embodiment, a procedure for housing the printed circuit board 32 into the case 74 will be described below. As shown in FIG. 10, the PCB connector 81 is screwed to one end portion of the printed circuit board, and the pin terminals extending from the housing 35 are soldered and attached to the printed circuit board 32.

In this state, the printed circuit board 32 is housed within the hollow space from below the case 74, and the connector 81 is inserted in the recess portion 80. In this state, the outer peripheral portion of the printed circuit board 32 is fastened to bosses 79 by screws. In this state, the hood portion 36 of the connector 81 Projects outside the case 74.

Figure 11A:
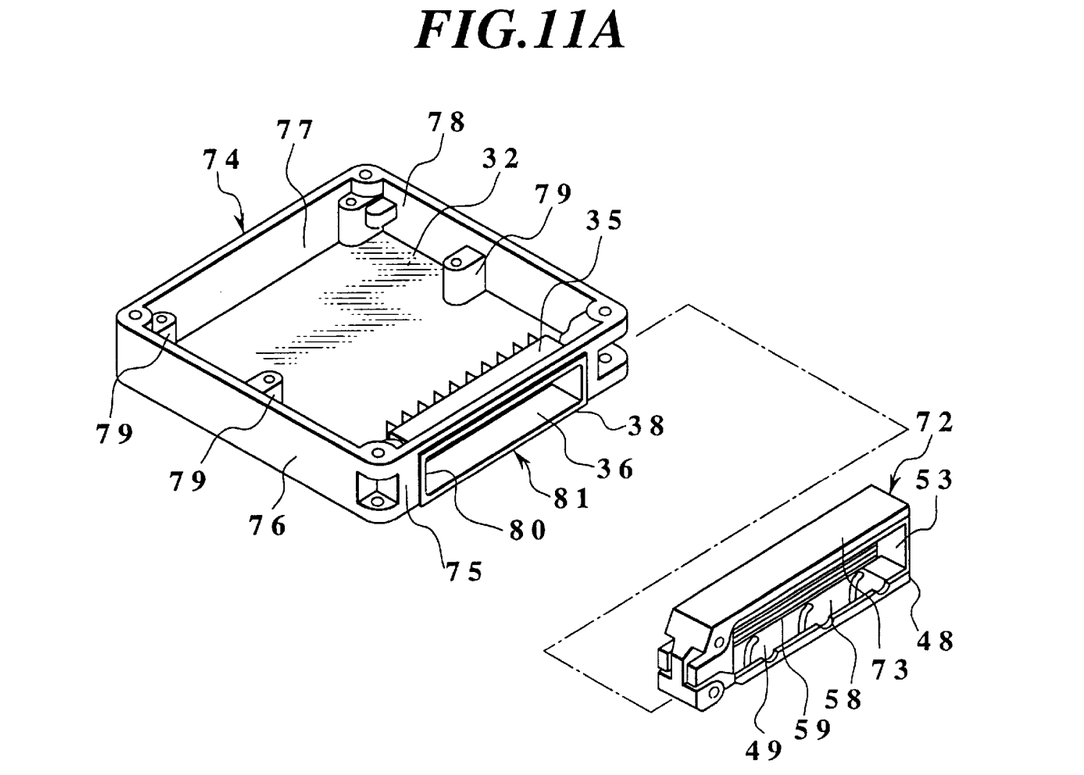
FIG. 11A is a perspective view of the PCB connector fitting structure of FIG. 10, with a mating connector fitting apparatus to be set thereto.
Figure 11B:
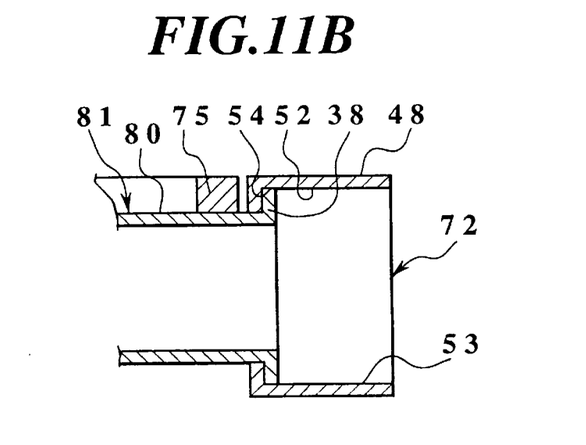
FIG. 11B is a partial sectional view of the PCB connector fitting structure of FIG. 10, with the mating connector fitting apparatus set thereto.

Next, as shown in FIGS. 11A and 11B, the fitting apparatus 72 is slid after its positioning to the one side portion of the case 74, and the fixing wall portion 38 is inserted into the fixing groove portion 54 of the fitting apparatus 72.

Then, in a state that the operating lever 73 is located at an open position apart from the upper surface of the frame member 48, the mating connector is Inserted in the frame member 48 from behind an opening 53 at the other side, and projections are engaged with cam grooves. Next, the operating lever 73 is rotated toward the upper surface of the frame member 48. When the operating lever 73 is so rotated, a moving member 49 moves in a longitudinal direction of the frame member 48. When the moving member 49 moves in the longitudinal direction of the frame member 48, the projections move along the cam grooves, thereby inserting the mating connector into the hood portion 36 of the connector 81. At this time, the frame member 48 is forced to go apart from the connector 81, and pressing forces are applied to the connector 81 from the mating connector toward the printed circuit board 32. However, the fixing wall portion 38 is brought into abutment with an inner wall of the fixing groove portion 54, and such the forces are cancelled.

Further, when using the fitting apparatus 72 to draw out the mating connector from the state attached to the hood portion 36 of the connector 81, the operating lever 73 put on the frame member 48 in a closed state is rotated in a direction in which it moves away from the frame member 48. When the operating lever 73 is rotated, the moving member 49 moves to the one side of the frame member 48 and moves the projections along the cam grooves in the departing direction relative to the connector 81. As a result, the mating connector is drawn out from the hood Portion 36 of the connector 81. At this time, the connector 81 is forced to move to the opposite side of the printed circuit board 32, as it is pulled by the mating connector, and the frame member 48 is forced to move toward the connector 81. However, the fixing wall portion 38 is brought into abutment with the inner wall of the fixing groove portion 54, and such the forces are cancelled In accordance with this embodiment, when attaching the mating connector to the connector 81 attached to the printed circuit board 32 in the case 74 as well as when removing the same, the concerned connectors push and pull each other, so that the connector 81 does not move with respect to the printed circuit board 32. As a result, no undue forces are applied to the soldered portions of the pin terminals 37 nor to the printed circuit board 32, thereby securely preventing a circuit disconnection.

Further, it is unnecessary to hold the PCB connector while moving the mating connector when attaching or removing the mating connector to or from the PCB connector, and the attaching operation as well as the removing operation can be easily performed.

Figure 12A:
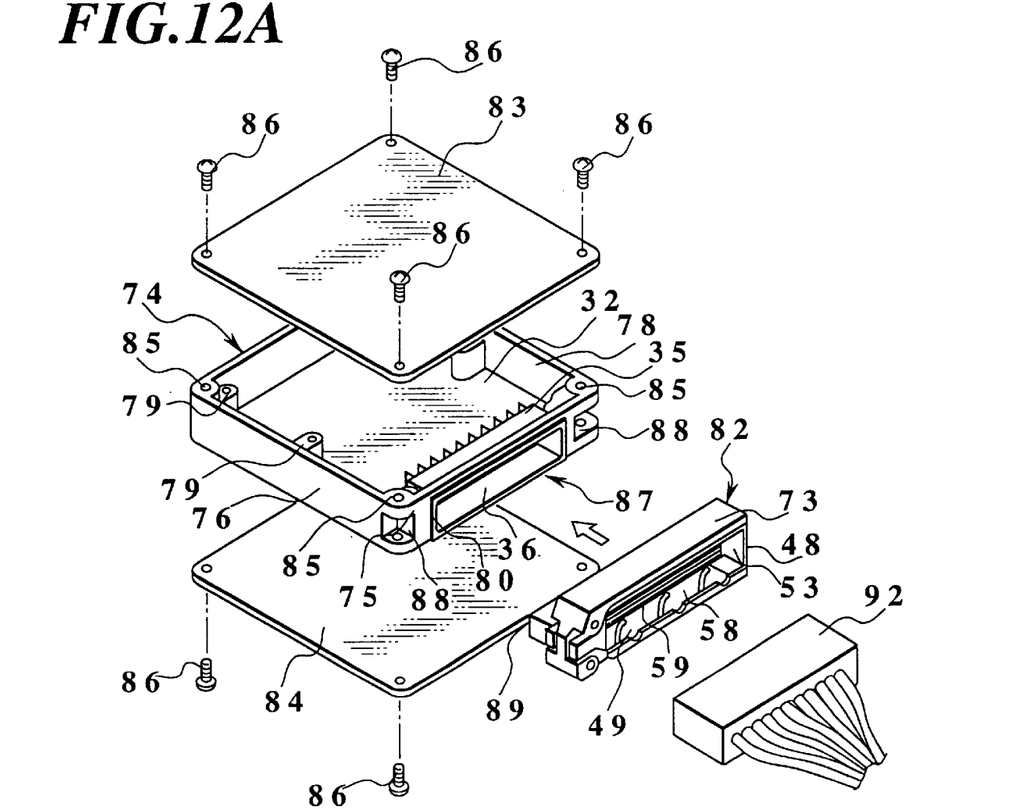
FIG. 12A is an exploded view of a PCB connector fitting structure according to another embodiment of the invention including a printed circuit board with a PCB connector fixed thereto, a case therefor and a mating connector fitting apparatus to be set thereto.
Figure 12B:
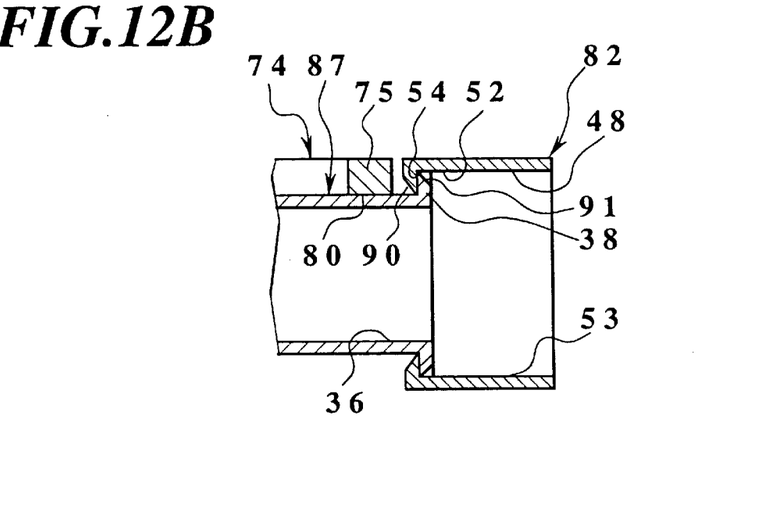
FIG. 12B is a partial sectional view of the PCB connector fitting structure of FIG. 12A, with the mating connector fitting apparatus set thereto.

Next, a fifth embodiment as shown in FIGS. 12A and 12B will be described below. This embodiment is different from the fourth embodiment in the mounting structure of a fitting apparatus 82 to the connector 81.

As shown in FIGS. 12A and 12B, the case 74 has the same structure as that of the fourth embodiment, and the upper and lower opening portions are closed by cover members 83 and 84. A hollow space is defined by side walls 75, 76, 77 and 78 and closed by the cover members 83 and 84 with screws 86 provided through four corners of the cover members 83 and 84 and driven into screw holes 85 formed at four corners of the case 74. Further, when a PCB connector 87 is inserted into the recess portion 80 of the side wall 75, a front end portion of a hood portion 36 of the connector 87 projects outside an opening end portion of the recess portion 80.

A pair of fixing portions 88 and 88 for a fixing of the fitting apparatus 82 at the case end are formed either in a connecting portion between the side walls 75 and 76 or in a connecting portion between the side walls 78 and 75. The case-end fitting apparatus fixing portions 88 and 88 are open outward. A pair of fixing portions 89 and 89 for attaching the fitting apparatus 82 at the fitting apparatus end are respectively inserted in the case-end fitting apparatus fixing portions 88 and 88.

The fitting apparatus 82 in accordance with this embodiment essentially has the same structure as the fitting apparatus 72 shown in FIG. 11A of the fourth embodiment, but is different in that the fitting-apparatus-end fixing portions 89 and 89 are formed on one surface of the frame member 48, that is, the mounting side of the connector 87. Further, a fixing groove portion 54 is formed in one side of the frame member 48 of the fitting apparatus 82 in accordance with this embodiment, like the fitting apparatus 82. A fixing wall portion 38 provided in a hood portion 36 of the connector 87 and is inserted into the fixing wall portion 54.

Still further, an inclined guiding surface 90 is formed at an end face of the frame member 48 constituting the fixing groove portion 54. The inclined surface 90 is brought into a slidable contact with an inclined surface 91 provided on the fixing wall portion 54 at the front end of the hood portion 36. The frame member 48 can be slightly bent due to a sliding contact and can go over the fixing wall portion 38. As a result, the fixing wall portion 38 is inserted into the fixing groove portion 54.

In the previous fourth embodiment, the fitting apparatus 82 is slid from one side of the connector 87 to insert the fixing wall portion 38 into the fixing groove portion 54. However, in the present fifth embodiment, the fitting apparatus 82 is attached from the front end of the hood portion 36 in the connector 87.

Further, in the fitting apparatus 82 in accordance with this embodiment, the fitting apparatus end fixing portion 89 is formed in both sides of the frame member 48 in the longitudinal direction. This fitting apparatus end fixing portion 89 is inserted into the case end fitting apparatus fixing portion 88 of the case 74 and is attached by screws for attaching the cover members 83 and 84 to the case 74.

Next, in this embodiment, a procedure of attaching the fitting apparatus 82 to the PCB connector 87 and a procedure of fitting a mating connector 92 to the connector 87 will be described below.

At first, the printed circuit board 32 is housed within the hollow space of the case 74 from thereunder and the connector 87 is inserted into the recess portion 80. Then, the printed circuit board 32 is attached to the bosses 79 by screws. Next, the fitting apparatus 82 is brought into contact with the hood portion 36 end of the connector 87, thereby fitting the fixing wall portion 38 into the fixing groove portion 54. Together with this operation, the fitting apparatus end fixing portion 89 is inserted into the case end fitting apparatus fixing portion 88. Then, the upper and lower opening portions of the case 74 are closed by the cover members 83 and 84, and are attached to the four corners of the case 74 by the screws 86. At this time, the fitting apparatus end fixing portion 89 is attached to the case end fitting apparatus fixing portion 88 by the screws 88 engaging with the screw hole between the side walls 75 and 76 and the screw 86 engaging with the screw hole between the side walls 78 and 75. Accordingly, the fitting apparatus 82 is attached to the case 74. In this case, since the force which is necessary for inserting the fixing wall portion 38 into the fixing groove portion 54 of the fitting apparatus 82 is small, the fixing wall portion 38 can be easily engaged with the fixing groove portion 54 by pressing the one side of the fitting apparatus 82 toward the hood portion 36 while holding the connector 87.

Further, in this state the operating lever 73 is located at the open position apart from the upper surface of the frame member 48.

Further, in the state with the fitting apparatus 82 engaged with the hood portion 36 of the connector 87, the fitting apparatus end fixing portion 89 is inserted into the case end fitting apparatus fixing portion 88. Then, the upper and lower opening portions of the case 74 are closed by the cover members 83 and 84 and are attached to the case 74 by the screws 86. At this time, the fitting apparatus end fixing portions 89 and 89 inserted into the case end fitting apparatus fixing portions 88 and 88 are also attached to the case 74 by the screws 86. As a result, the fitting apparatus 82 is attached to the case 74.

Next, the mating connector 92 is inserted into the frame member 48 from behind an opening at the other side of the frame member 48, and the projections of the mating connector 92 are engaged with the cam grooves. In this state, the operating lever 73 is rotated toward the upper surface of the frame member 48. When the operating lever 73 is rotated, the moving member 49 moves toward one side of-the frame member 48 in the longitudinal direction. When the moving member 49 moves to the one side of the frame member 48 in the longitudinal direction, the projections within the cam grooves move to a hood portion 36 end of the connector 87 and the mating connector 92 moves to the hood portion 36 end. As a result, the mating connector 92 is inserted into the hood portion 36 of the connector 87.

At this time, the connector 87 receives an insertion force acting against the printed circuit board 32 end from the mating connector 92. However, the fixing wall portion 38 is brought into abutment with an inner wall of the fixing groove portion 54, and the moving operation is restricted. Further, the frame member 48 receives a force acting in a departing direction relative to the connector 87. However, as the fitting apparatus 82 is attached to the case 74, the movement is restricted. Still further, as the fitting apparatus 82 is attached to the case 74, the fitting apparatus 82 does not move even when the fixing wall portion 38 is brought into contact with the inner wall of the fixing groove portion 54, and the connector 87 does not move.

On the other hand, when drawing out the mating connector 92 fitted in the hood portion 36 of the connector 87, the operating lever 73 in a closed state on the frame member 48 is rotated toward the open position. When the operating lever 73 is rotated to the open position apart from the upper surface of the frame member 48, the moving member 49 is moved, guiding the projections along the cam grooves in directions in which they go away from the hood portion 36. As a result, the mating connector 92 is drawn out from inside the hood portion 36.

At this time, the connector 87 receives a force acting in the direction in which the mating connector 92 is drawn. However, the fixing wall portion 38 is brought into abutment with the inner wall of the fixing groove portion 54, and the movement is restricted. Further, the fitting apparatus 82 receives a force acting toward a connector 87 end. However, as the fitting apparatus 82 is fixed to the case 74, the movement is restricted.

In accordance with this embodiment, like the fourth embodiment, when fitting the mating connector to the connector 87 is attached to the printed circuit board 32 in the case 74 as well as when removing the same, the connectors are relatively attracted or repelled by the fitting apparatus 82 and the fitting apparatus 82 is fixed to the case 74 by screws, so that the connector 87 does not move relative to the printed circuit board 32. Therefore, no undue forces are applied to those portions of the pin terminals soldered to the printed circuit board, thereby securely preventing disconnection of the circuit.

Further, in accordance with this embodiment, as the fitting apparatus 82 is temporarily engaged with the outer periphery of the hood portion 36, the fitting apparatus 82 can be easily attached to the case 74 when the upper and lower opening portions of the case 74 are closed by the cover members 83 and 84.

While preferred embodiments of the present invention have been described using specific terms, such description is for illustrative purposes, and it is to be understood that changes and variations may be made without departing from the spirit or scope of the following claims.

What is claimed is:

1. A printed circuit board connector fitting structure comprising: a case;
    a printed circuit board accommodated in the case;
    a printed circuit board connector fixed to the printed circuit board, comprising a first connector having a connector housing;
a second connector fittable to the first connector; and
support means for supporting the connector housing relative to the case to have the case receive a force applied from the second connector, the support means being formed by use of the case and the connector housing.

2. A printed circuit board connector fitting structure according to claim 1, wherein the support means comprises a joint for joining the connector housing to the case.

3. A printed circuit board connector fitting structure according to claim 2, wherein:
    the case has an opening;
    the connector housing is fitted in the opening at a mediate portion thereof between a fixed end thereof fixed to the printed circuit board and a fitting end thereof fittable on the second connector; and
    the joint comprises a groove in a circumference of the opening and a projection on the mediate portion.

4. A printed circuit board connector fitting structure according to claim 3, wherein the groove extends in a second direction perpendicular to a first direction.

5. A printed circuit board connector fitting structure according to claim 2, wherein the joint comprises a dovetail joint.

6. A printed circuit board connector fitting structure according to claim 1, further comprising:
    a connector fitting mechanism including:
        an actuator for actuating the second connector in a first direction and for actuating the second connector in a reverse direction; and
        a frame for supporting the actuator: and
    hold means for holding the frame to one of the case and the connector housing.

7. A printed circuit board connector fitting structure according to claim 6, wherein the hold means comprises a pair of mutually engageable elements fixed either to both the frame and the connector housing.

8. A printed circuit board connector fitting structure according to claim 7, wherein the mutually engageable elements comprise:
    a groove extending in a second direction perpendicular to the first direction; and
    a projection engagable with the groove.

9. A printed circuit board connector fitting structure according to,claim 7, wherein the mutually engageable elements comprise:
    a body portion of the connector housing; and
    a hood portion of the frame fittable on the body portion.

10. A printed circuit board connector fitting structure according to claim 9, wherein the hood portion has a hook part hooking on one side of the body portion and an abutment part abutting on another side of the body portion opposite to the one side thereof in the first direction.

11. A printed circuit board connector fitting structure according to claim 6, wherein the hold means comprises a fixing means that is attached to the case.

12. A printed circuit board connector fitting structure according to claim 11, further comprising:
    covers for enclosing the case; and
    screws for fastening the covers and the fixing part of the frame to the case.

* * * * *